US009580837B2

United States Patent
Zwieback et al.

(10) Patent No.: US 9,580,837 B2
(45) Date of Patent: *Feb. 28, 2017

(54) METHOD FOR SILICON CARBIDE CRYSTAL GROWTH BY REACTING ELEMENTAL SILICON VAPOR WITH A POROUS CARBON SOLID SOURCE MATERIAL

(71) Applicant: II-VI Incorporated, Saxonburg, PA (US)

(72) Inventors: Ilya Zwieback, Township of Washington, NJ (US); Varatharajan Rengarajan, Flanders, NJ (US); Bryan K. Brouhard, Budd Lake, NJ (US); Michael C. Nolan, Andover, NJ (US); Thomas E. Anderson, Morristown, NJ (US)

(73) Assignee: II-VI Incorporated, Saxonburg, PA (US)

( * ) Notice: Subject to any disclaimer, the term of this patent is extended or adjusted under 35 U.S.C. 154(b) by 269 days.

This patent is subject to a terminal disclaimer.

(21) Appl. No.: 14/475,803

(22) Filed: Sep. 3, 2014

(65) Prior Publication Data

US 2016/0060789 A1    Mar. 3, 2016

(51) Int. Cl.
*C30B 23/02* (2006.01)
*C30B 29/36* (2006.01)
(Continued)

(52) U.S. Cl.
CPC ............ *C30B 29/36* (2013.01); *C30B 25/02* (2013.01); *C30B 25/20* (2013.01)

(58) Field of Classification Search
CPC .......... C30B 23/00; C30B 23/02; C30B 23/06; C30B 23/063; C30B 23/066; C30B 25/00; C30B 25/02; C30B 25/10; C30B 25/14; C30B 25/16; C30B 25/165; C30B 25/20; C30B 29/00; C30B 29/10; C30B 29/36
(Continued)

(56) References Cited

U.S. PATENT DOCUMENTS 5,667,587 A    9/1997  Glass et al.
5,683,507 A    11/1997 Barrett et al.
(Continued)

FOREIGN PATENT DOCUMENTS

WO    97/01658 A1    1/1997
WO    97/13013 A1    4/1997

OTHER PUBLICATIONS

M. A. Fanton, "Growth of Single Crystal Silicon Carbide by Halide Chemical Vapor Deposition", A thesis in Materials Science and Engineering, The Pennsylvania State University, The Graduate School Department of Materials Science and Engineering, Dec. 2007.

*Primary Examiner* — Kenneth A Bratland, Jr.
(74) *Attorney, Agent, or Firm* — The Webb Law Firm

(57) ABSTRACT

In a method for growing bulk SiC single crystals using chemical vapor transport, wherein silicon acts as a chemical transport agent for carbon, a growth crucible is charged with a solid carbon source material and a SiC single crystal seed disposed therein in spaced relationship. A halosilane gas, such as $SiCl_4$ and a reducing gas, such as $H_2$, are introduced into the crucible via separate inlets and mix in the crucible interior. The crucible is heated in a manner that encourages chemical reaction between the halosilane gas and the reducing gas leading to the chemical reduction of the halosilane gas to elemental silicon (Si) vapor. The produced Si vapor is transported to the solid carbon source material where it reacts with the solid carbon source material yielding volatile Si-bearing and C-bearing molecules. The produced Si-bearing and C-bearing vapors are transported to the SiC single crystal seed and precipitate on the SiC single crystal seed causing growth of a SiC single crystal on the SiC single crystal seed.

16 Claims, 2 Drawing Sheets

(51) Int. Cl.
  *C30B 25/20*    (2006.01)
  *C30B 25/02*    (2006.01)

(58) Field of Classification Search
  USPC ...... 117/84, 88, 99, 102, 200, 204, 937, 951
  See application file for complete search history.

(56) References Cited

U.S. PATENT DOCUMENTS

| | | |
|---|---|---|
| 5,746,827 A | 5/1998 | Barrett et al. |
| 6,805,745 B2 | 10/2004 | Snyder et al. |
| 6,824,611 B1 * | 11/2004 | Kordina ................. C30B 23/00 117/105 |
| 8,512,471 B2 * | 8/2013 | Zwieback ............... C30B 23/00 117/104 |
| 2001/0004877 A1 * | 6/2001 | Shigeto .................. C30B 23/00 117/84 |
| 2005/0255245 A1 | 11/2005 | Fanton et al. |
| 2007/0262322 A1 * | 11/2007 | Nakabayashi .......... C30B 23/00 257/77 |
| 2012/0152165 A1 | 6/2012 | Hara et al. |
| 2012/0225004 A1 * | 9/2012 | Zwieback ............... C30B 29/36 423/345 |

* cited by examiner

METHOD FOR SILICON CARBIDE CRYSTAL GROWTH BY REACTING ELEMENTAL SILICON VAPOR WITH A POROUS CARBON SOLID SOURCE MATERIAL

BACKGROUND OF THE INVENTION

Field of the Invention

The present invention relates to silicon carbide (SiC) crystal growth and, more particularly, to the methods of growing bulk SiC single crystals from the gaseous phase or vapor phase.

Description of Related Art

Single crystals of silicon carbide of 4H and 6H polytypes serve as lattice-matched substrates in SiC— and AlGaN-based semiconductor devices, including ultra-high-frequency AlGaN-based HEMT transistors and SiC-based devices for power switching, including Schottky diodes, field-effect transistors and bipolar transistors. Other applications include ultra-fast photoconductive switches, sensors for harsh environments, radiation detectors and others.

At present, common requirements for SiC substrates include: specific electronic properties, such as conducting n-type, conducting p-type, semi-insulating Nu-type or semi-insulating Pi-type; high crystal quality with low densities of crystal defects, such as dislocations, micropipes and carbon inclusions; large substrate diameter, such as 100 mm, 150 mm, and 200 mm. The SiC substrates must be affordable to compete with other applicable substrate materials.

Large-size commercial SiC single crystals are conventionally grown by the technique of Physical Vapor Transport (PVT). PVT growth is carried out in a sealed crucible most commonly made of graphite. In preparation for growth, the crucible is charged with polycrystalline SiC source material commonly disposed at the crucible bottom and a SiC single crystal seed commonly disposed at the crucible top. The loaded crucible is filled with inert gas to a desired pressure—generally between several and 50 Torr—and heated to the growth temperature, which is generally between 2000° C. and 2400° C. A vertical temperature gradient is created in the crucible between the SiC source and SiC seed, wherein the SiC source material temperature is higher than that of the SiC single crystal seed.

At high temperatures, the SiC source material sublimes releasing into the crucible interior a spectrum of volatile molecules, such as Si, $Si_2C$ and $SiC_2$. Driven by the vertical temperature gradient, these species migrate to the SiC seed and condense on it causing growth of a SiC single crystal on the SiC single crystal seed. Prior art in the area of PVT growth of silicon carbide includes U.S. Pat. No. 6,805,745; U.S. Pat. No. 5,683,507; U.S. Pat. No. 5,667,587 and U.S. Pat. No. 5,746,827, all of which are incorporated herein by reference.

The conventional PVT growth process has shortcomings. Specifically, due to the incongruent character of silicon carbide sublimation, the stoichiometry of the vapor phase changes progressively during PVT growth from an initial excess of silicon towards an excess of carbon. This leads to source attrition, generation of carbon residue in the SiC source, and the appearance of carbon inclusions in the grown SiC crystal leading to crystal defects, such as dislocations and micropipes.

Several alternatives to PVT are known in the art. Among them the methods of High Temperature CVD (HTCVD), Halide CVD (HCVD), High Temperature Gas Source Method (HTGSM) and Halosilane Assisted PVT (HAPVT) disclosed in U.S. Pat. No. 6,824,611; EP0835336; EP0859879; US 2005/0255245 and US 2012/0152165, all of which are incorporated herein by reference.

All of the aforementioned methods are variations of the general method of Chemical Vapor Deposition (CVD) carried out at high temperatures of SiC sublimation growth. During growth, a gaseous silicon precursor (silane or halosilane), and a gaseous carbon precursor (a hydrocarbon, such as propane or methane), are injected into the growth crucible, where they react and form a variety of Si—C—H or Si—C—H—Cl gaseous molecules. These species migrate towards the SiC single crystal seed, adsorb on a growth interface of the SiC single crystal seed, and react in the adsorbed state causing growth of the SiC single crystal on the SiC single crystal seed. Gaseous byproducts desorb from the growth interface and leave the crucible through provided gas outlets or passages.

One of the disadvantages of the HTCVD, HCVD and HTGSM techniques stems from the use of gaseous hydrocarbons and silane, which are thermally unstable and decompose when exposed to elevated temperatures. Their thermal decomposition is accompanied by precipitation of carbon and elemental silicon leading to clogging of the gas outlets. In order to reduce this undesirable thermal decomposition, strong dilution with hydrogen, as well as high gas flow rates are employed. This, in turn, leads to low efficiency of crystallization and losses of expensive raw materials.

The method of HAPVT disclosed in U.S. Pat. No. 8,512,471, which is incorporated herein by reference, is a modified PVT technique, wherein a PVT crucible is loaded in a conventional fashion with the SiC source material (powder) and the SiC single crystal seed, and then heated to SiC sublimation growth temperatures. During growth, small amounts of a gaseous halosilane, such as $SiCl_4$, are introduced into the crucible; optionally, hydrogen can be introduced as well. The presence of reactive gases in the crucible leads to chemical reactions between halogen, hydrogen and chemical elements present in the growth system. The benefits include removal of unwanted impurities and facilitation of SiC crystal growth.

SUMMARY OF THE INVENTION

The inventors have discovered that at high temperatures Si vapor can act as a chemical transport agent for carbon. According to the present invention, elemental Si vapor is generated in the crucible interior during a SiC growth process and used to transport carbon from a pure (or substantially pure) carbon source material to the SiC seed in the form of $Si_2C$ and $SiC_2$ molecules which precipitate on the seed causing SiC crystal growth. Accordingly, in this SiC crystal growth method of invention, neither solid SiC source material, nor hydrocarbon gas is required.

In preparation for growth, a graphite crucible is charged with a pure (or substantially pure) solid carbon source material and a SiC seed crystal seed, which are disposed therein in spaced relationship. Upon crucible heating, a halosilane gas diluted by an inert gas and a reducing gas are introduced into the crucible. The reactive gases mix in the crucible interior and participate in chemical reactions leading to the reduction of halosilane to elemental silicon in the form of Si vapor. The produced Si vapor is then transported by the gas flow to the solid carbon source material where it reacts with carbon of the solid carbon source material yielding volatile Si-bearing and C-bearing molecules, such as $SiC_2$ and $Si_2C$. The mixture of Si, $SiC_2$ and $Si_2C$ vapors is further transported by the gas flow to the SiC seed where the vapors precipitate on the SiC single crystal seed, thus causing growth of a SiC single crystal on the SiC single crystal seed.

Herein, the halosilane gas is desirably a thermally stable gaseous halosilane.

During growth of the SiC single crystal by the method of invention, the stoichiometry of the vapor phase in the graphite crucible does not change with time. Rather, the growth process is steady-state and it can be carried out as long as the solid carbon source material lasts.

More specifically, disclosed herein is method of SiC crystal growth by chemical transport reactions, wherein silicon vapor is used as a chemical transport agent for otherwise nonvolatile carbon. This method can be called Chemical Vapor Transport by Silicon, or SiCVT. The method includes: (a) providing a SiC growth system that includes a silicon carbide seed crystal and solid carbon source material positioned in spaced relation; (b) heating the SiC growth system and introducing into the SiC growth system a gaseous halosilane and a reducing gas, wherein the gaseous halosilane and the reducing gas react in the SiC growth system yielding elemental silicon vapor; (c) causing the elemental silicon vapor of step (b) to react with the solid carbon source material of step (a) yielding silicon-bearing and carbon-bearing vapors; (d) causing the silicon-bearing and carbon-bearing vapors of step (c) to be transported to the SiC seed of step (a); and (e) causing the silicon-bearing and carbon-bearing vapors of step (c) to precipitate on the SiC seed of step (a) to grow the silicon carbide single crystal.

The halosilane gas and the reducing gas can be separately introduced into the SiCVT growth system.

Step (b) can occur in a reaction zone that exists on a side of the solid carbon source material opposite the silicon carbide seed crystal.

The SiCVT growth system can be heated such that a temperature gradient forms where the silicon carbide seed crystal is at a lower temperature than the solid carbon source material.

The SiCVT growth system can include a growth crucible. All of the solid carbon source material can be positioned in spaced relation between the ends of the growth crucible. The silicon carbide seed crystal can positioned on one end of the growth crucible.

The growth crucible can include one or more gas inlets for introducing the gaseous halosilane and the reducing gas into an end of the growth crucible opposite the silicon carbide seed crystal. The growth crucible can include one or more gas outlets at the end of the growth crucible where the silicon carbide seed crystal is positioned.

The inert gas, the remaining after reaction reducing gas, the gaseous byproducts of the reaction between the halosilane and the reducing gas, as well as silicon-bearing and carbon-bearing vapors that do not precipitate on the silicon carbide seed crystal—all these gases can exit the growth crucible via the one or more gas outlets.

The growth crucible can include a perforated plate supporting all of the solid carbon source material in spaced relation to an end of the growth crucible opposite the silicon carbide seed crystal. The space between the perforated plate and the end of the growth crucible opposite the silicon carbide seed crystal can define a reaction zone where step (b) occurs.

The heating can occur such that a temperature gradient forms whereupon the silicon carbide seed crystal is at a lower temperature than the reaction zone.

The growth crucible and the perforated plate can be made from a material that is stable against erosion by Si vapor at SiC growth temperatures. In an embodiment, the growth crucible and the perforated plate are made from dense graphite.

The thermally stable, gaseous halosilane can be $SiCl_4$. The reducing gas can be hydrogen.

The silicon carbide seed crystal is a 4H, 6H, or 3C polytype.

The method can include introducing a nitrogen containing gas into the SiC growth system to grow an n-type silicon carbide single crystal.

The method can include introducing a gaseous aluminum precursor into the SiC growth system to grow a p-type silicon carbide single crystal.

The method can include introducing a gaseous vanadium precursor into the SiC growth system to grow a vanadium-doped, semi-insulating silicon carbide single crystal.

Also disclosed herein is method of silicon carbide crystal growth by chemical transport. The method includes: (a) in a growth system that includes a silicon carbide seed crystal and solid carbon source material positioned in spaced relation, heating the SiC growth system in a manner that encourages growth of the silicon carbide crystal on the silicon carbide seed crystal by chemical transport; (b) concurrent with step (a), introducing into the growth system a gaseous halosilane and a reducing gas, wherein the gaseous halosilane and the reducing gas react in the growth system yielding elemental silicon vapor; (c) controlling the flow of the gaseous halosilane and the reducing gas and the heating such that the elemental silicon vapor of step (b) is transported to and reacts with the solid carbon source material yielding silicon-bearing and carbon-bearing vapors; and (d) further controlling the flow of the gaseous halosilane and the reducing gas and the heating such that the silicon and carbon bearing vapors of step (c) are transported to and precipitate on the silicon carbide seed crystal.

The method can include introducing a nitrogen containing gas into the SiC growth system to grow an n-type silicon carbide single crystal.

The method can include introducing a gaseous aluminum precursor into the SiC growth system to grow a p-type silicon carbide single crystal.

The method can include introducing a gaseous vanadium precursor into the SiC growth system to grow a vanadium-doped, semi-insulating silicon carbide single crystal.

DETAILED DESCRIPTION OF THE INVENTION

Figure 1:
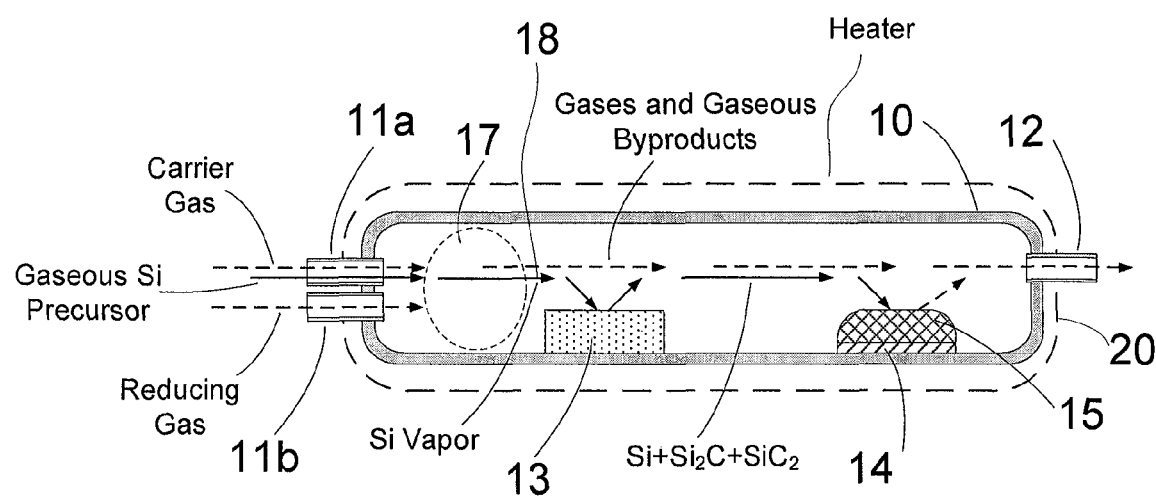
FIG. 1 is a conceptual drawing of an imaginary apparatus for SiCVT growth of a SiC single crystal.

FIG. 1 is a conceptual diagram that helps to understand the principle of invention. With reference to FIG. 1 an ampoule 10, made of a material which is stable against attack by silicon vapor, includes inlets 11a and 11b, and an outlet 12. Ampoule 10 is charged with a solid carbon source material 13 and a SiC single crystal seed 14, which are disposed at a distance (or in spaced relation) to each other, as shown schematically in FIG. 1. Ampoule 10 is placed inside a heater 20 and heated such that the temperature of solid carbon source material 13 is higher than that of SiC single crystal seed 14.

An inert carrier gas, such as argon, enters ampoule 10 through inlet 11a carrying an additive of a thermally stable gaseous halosilane, such as, without limitation, silicon tetrachloride, $SiCl_4$. The gaseous halosilane, as discussed hereafter, acts as a Si precursor. Simultaneously, a reducing gas, such as hydrogen $H_2$, enters ampoule 10 through inlet 11b. Inside ampoule 10 the halosilane gas mixes and reacts with the reducing gas causing chemical reduction of the Si precursor (i.e., in this example, the $SiCl_4$ gas) to elemental silicon (Si) in the form of Si vapor 18. A reaction zone 17 in ampoule 10 is where the gaseous halosilane and the reducing gas mix and react. It is envisioned that in addition to the inert carrier gas, reducing gas and Si vapor, the gas mixture in the reaction zone 17 may contain gaseous hydrogen chloride (HCl), as well as small amounts of chlorine (Cl, $Cl_2$) and gaseous halosilanes such as $SiCl_4$, $SiCl_2$ and SiHCl.

Si vapor 18, driven by the flow of one or both of the carrier gas and the reducing gas, is transported towards solid carbon source material 13 and comes in contact with solid carbon source material 13. Upon contact with solid carbon source material 13, Si vapor 18 reacts with the carbon of said solid carbon source material 13 producing gaseous molecules of $Si_2C$ and $SiC_2$. It is envisioned that not all of the Si vapor 18 will be consumed by reaction with the carbon of solid carbon source material 13, and the partial pressures of the $Si_2C$, $SiC_2$ and Si vapors in the vapor phase are expected to approach those in the three-phase SiC—Si-Vapor system under equilibrium.

Following reaction of the Si vapor with the carbon source and production of gaseous molecules of $Si_2C$ and $SiC_2$, the mixture of $Si_2C$, $SiC_2$ and Si vapors is further transported by the carrier gas and/or the reducing gas towards SiC crystal seed 14, where said mixture precipitates on SiC single crystal seed 14 causing growth of a SiC single crystal 15 on SiC single crystal seed 14. The carrier gas, remaining reducing gas (hydrogen), and various Cl-containing gaseous byproducts escape ampoule 10 via outlet 12.

From the standpoint of chemistry, FIG. 1 shows a classic arrangement for chemical vapor transport, wherein Si vapor 18 plays the role of a chemical transport agent for carbon which otherwise is non-volatile.

An exemplary, non-limiting embodiment of the present invention will now be described with reference to FIG. 2.

Exemplary Embodiment

Figure 2:
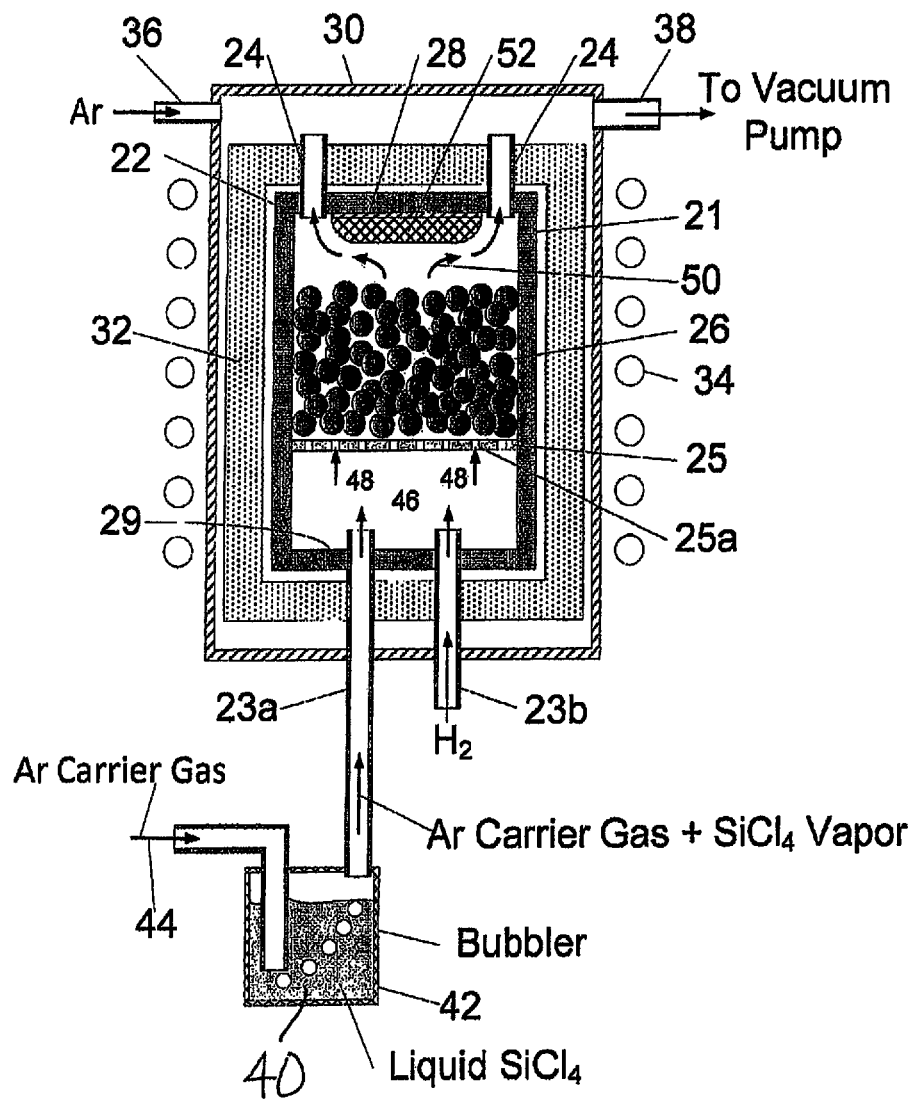
FIG. 2 is a drawing showing an exemplary apparatus for SiCVT growth of a SiC single crystal.

With reference to FIG. 2, a graphite crucible 21 is prepared having the following dimensions: diameter, desirably, between 100 and 200 mm, height, desirably, between 150 and 250 mm, and wall thickness, desirably, between 8 and 16 mm. Crucible 21 is provided with gas inlets 23a, 23b, one or more gas outlets 24, and a lid 22. A perforated graphite support plate 25, having a plurality of through-holes 25a therethrough, is disposed between lid 22 and a bottom 29 of crucible 21, e.g., around the middle part of crucible 21.

Graphite crucible 21 and graphite support plate 25 are made of dense, fine-grain, low-porosity, purified graphite having the density, desirably, between 1.82 $g/cm^3$ and 1.95 $g/cm^3$. Examples of suitable graphite are grades G347 and G348 available from Tokai USA (4495 NW 235th Ave, Hillsboro, Oreg. 97124). After halogen purification to ≤1 ppm of ash, the graphite forming graphite crucible 21 and graphite support plate 25 attains a high degree of stability against attack by silicon vapor at high temperatures of SiC crystal growth (2000° C.-2300° C.). That is, the graphite material forming graphite crucible 21 and graphite support plate 25 is able to withstand attack by Si vapor for a sufficiently long time (up to 100 hours) with losses to erosion not exceeding 2% of the initial weight of each of crucible 21 and plate 25.

Crucible 21 is charged with solid carbon source material 26 and a SiC single crystal seed 28 in spaced relation. SiC single crystal seed 28 is attached to crucible lid 22 using means known in the art, such as mechanical attachment or bonding with high-temperature carbonaceous glue. Solid carbon source material 26 is disposed on graphite support plate 25.

Solid carbon source material 26 is a pure (or substantially pure), porous carbon material having large specific surface area. In an embodiment, solid carbon source material 26 is in the form of porous carbon pellets, spheres, and/or granules having a mean grain size (diameter), desirably, between 0.5 mm and 6 mm; an apparent density, desirably, between 0.4 $g/cm^3$ and 1.0 $g/cm^3$; and a surface area, desirably, between 200 and 2000 $m^2/g$. Examples of carbon materials suitable for application as solid carbon source material 26 are high-purity carbon spheres FU 4562 available from Schunk Graphite Technology (W146 N9300 Held Drive, Menomonee Falls, Wis. 53051), high-purity carbon pellets FU 2602/35 (also available from Schunk), and high-purity pelletized carbon black N990UP available from Cancarb (1702 Brier Park Crescent N.W. Medicine Hat, Alberta T1C 1T9 Canada). Due to the high porosity and large specific surface area, the aforementioned examples of solid carbon source materials exhibit a much higher reactivity towards silicon vapor at elevated temperatures, compared to the dense graphite materials used to form graphite crucible 21 and graphite support plate 25. The purity of solid carbon source material 26 is, desirably, 99.999% or better and, more desirably, 99.9999% or better.

The diameter of through-holes 25a in graphite support plate 25 is such that said through-holes 25a avoid or prevent sold carbon source material 26, in the form of pellets, spheres, and/or granules, from falling through graphite support plate 25, while facilitating or allowing the flow of gases across graphite support plate 25. In an embodiment, the thickness of graphite support plate 25 is between 3 and 6 mm, and the diameter of each through-hole 25a is between 0.4 and 4 mm.

Graphite crucible 21 charged with SiC single crystal seed 28 and solid carbon source material 26 is placed inside of a chamber 30 where it is surrounded by a thermal insulation 32. Thermal insulation 32 is made of lightweight fibrous graphite, such as graphite felt or foam. In an embodiment, chamber 30 is water-cooled and is made of fused silica. A heating means 34 is utilized for heating crucible 21 to SiC growth temperatures. In embodiment, heating means 34 may be realized by an exterior RF coil or an interior resistance heater.

In preparation for crystal growth, chamber 30 is evacuated using a vacuum pump and filled to a desired pressure with argon supplied through inlet 36. By controlling the flow of argon gas introduced into chamber 30 via gas inlet 36 and the operation of a vacuum pump connected to outlet 38 of chamber 30, the Ar pressure inside of chamber 30 and, hence, crucible 21 is controlled to a pressure, desirably, between 50 and 300 Torr.

Crucible 21 charged with solid carbon source material 26 and SiC single crystal seed 28 is heated via heating means 34 to the SiC crystal growth temperature, which is, desirably, between 2000° C. and 2300° C. The heating is such that a temperature gradient, desirably, between 30° C. and 150° C. is established between the hotter solid carbon source material 26 and the colder SiC single crystal seed 28.

Process gases of SiCl$_4$ and H$_2$ are supplied into heated graphite crucible 21 via gas inlets 23a and 23b respectively. More specifically, a carrier gas, such as argon, enters graphite crucible 21 via inlet 23a carrying an additive of gaseous SiCl$_4$. The means of SiCl$_4$ delivery is known in the art (see for example M. Fanton "Growth of Single Crystal Silicon Carbide by Halide Chemical Vapor Deposition" Ph.D. Thesis, 2007, Penn State University). In an embodiment, liquid SiCl$_4$ (shown as item 40 in FIG. 2) is disposed in a bubbler 42 maintained at a temperature below 20° C., while gaseous argon 44 bubbling through the liquid SiCl$_4$ is used to bring SiCl$_4$ vapor into growth crucible 21.

In an embodiment, the mass flow rate of Ar carrier gas supplied into the bubbler 42 is, desirably, between 60 sccm and 350 sccm; the temperature of the liquid SiCl$_4$ contained in bubbler 42 is, desirably between 14° C. and 18° C.; the mass flow rate of SiCl$_4$ vapor supplied into growth crucible 21 is, desirably, between 12 sccm and 70 sccm of SiCl$_4$ which corresponds to the rate of Si delivery, approximately, between 1 g and 6 g of Si per hour. Hydrogen H$_2$ enters the crucible through inlet 23b at a flow rate, desirably, between 70 sccm and 300 sccm.

The SiCl$_4$ vapor and H$_2$ gas mix in growth crucible 21 in a reaction zone 46. While resident in reaction zone 46, the SiCl$_4$ vapor and the H$_2$ gas participate in chemical reactions leading to chemical reduction of SiCl$_4$ to elemental Si in the form of Si vapor. In a simplified form, these reactions can be presented as the following summary reaction:

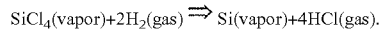

$$\text{SiCl}_4(\text{vapor}) + 2\text{H}_2(\text{gas}) \rightarrow \text{Si}(\text{vapor}) + 4\text{HCl}(\text{gas}).$$

The produced Si vapor shown as arrows 48 is transported upward by the flow of process gases introduced into gas inlets 23a and 23b and passes through through-holes 25a made in perforated graphite support plate 25. In the space above plate 25, said Si vapor 48 comes into contact with solid carbon source material 26. Si vapor 48 reacts with the carbon of solid carbon source material 26 producing gaseous molecules of Si$_2$C and SiC$_2$. Not all of Si vapor 48 will react with the carbon of solid carbon source material 26, and the partial pressures of Si$_2$C, SiC$_2$ and Si vapors in the vapor phase are expected to approach those in the three-phase SiC—Si-Vapor system under equilibrium.

The mixture of Si$_2$C, SiC$_2$ and Si vapors (shown by arrows 50 in FIG. 2) is further transported by the flow of process gases introduced into gas inlets 23a and 23b toward SiC single crystal seed 28. Upon contact with SiC single crystal seed 28, the Si$_2$C, SiC$_2$ and Si vapors 50 precipitate on said SiC single crystal seed 28 causing growth of SiC single crystal 52 on SiC single crystal seed 28.

Following precipitation of the Si-bearing and C-bearing vapors on SiC single crystal seed 28 to form the growing SiC single crystal 52, the carrier gas (e.g., Ar), the excess hydrogen H$_2$, hydrogen chloride gas HCl and various gaseous byproducts escape growth crucible 21 via the one or more outlets 24. Under the influence of vacuum pump acting on gas outlet 38 of chamber 30, carrier gas, excessive hydrogen H$_2$, HCl and all gaseous byproducts are removed from chamber 30. Gaseous byproducts can include small amounts of various molecules containing Cl and Si—H—Cl groups such as SiCl$_2$, SiCl$_4$, SiHCl and other.

The above-described method can be utilized for the growth of doped SiC single crystals 52. For the growth of n-type SiC single crystals, doping with nitrogen (N$_2$) gas can be used. To achieve this, a desired amount of N$_2$ can be added to the flow of carrier gas (Ar) introduced into gas inlet 23a. Alternatively, N$_2$ can be added to the flow of hydrogen gas introduced into gas inlet 23b.

For the growth of p-type SiC single crystals, doping with aluminum can be used. This requires a gaseous Al precursor, such as trimethyaluminum (TMA, C$_3$H$_9$Al). In order to grow aluminum doped SiC single crystals 52, a desired amount of gaseous TMA can be added to the flow of H$_2$ introduced into graphite growth crucible 21 via gas inlet 23b.

For the growth of semi-insulating SiC single crystals, doping with vanadium can be used. This requires a gaseous chlorinated vanadium precursor, such as vanadium tetrachloride VCl$_4$. In order to grow vanadium doped crystals, a desired amount of gaseous VCl$_4$ can be added to the flow of carrier gas (Ar) carrying SiCl$_4$ prior to introduction into graphite growth crucible 21 via gas inlet 23a.

The present invention has been described with reference to the accompanying figures. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method for SiC crystal growth by chemical vapor transport with silicon comprising:
   (a) providing a SiC growth system that includes a silicon carbide seed crystal and solid carbon source material positioned in spaced relation;
   (b) heating the SiC growth system and introducing into the SiC growth system a gaseous halosilane and a reducing gas, wherein the gaseous halosilane and the reducing gas react in the SiC growth system yielding elemental silicon vapor;
   (c) reacting the elemental silicon vapor of step (b) with the solid carbon source material of step (a) yielding silicon-bearing and carbon-bearing vapors;
   (d) transporting the silicon-bearing and carbon-bearing vapors of step (c) to the SiC seed of step (a); and
   (e) precipitating the silicon-bearing and carbon-bearing vapors of step (c) on the SiC seed of step (a) to grow the silicon carbide single crystal, wherein:
   the solid carbon source material is comprised of porous carbon in a form of one or more of pellets, spheres, and granules having at least one of the following:
   a mean grain size of between 0.5 mm and 6 mm;
   a density between 0.4 g/cm$^3$ and 1.0 g/cm$^3$; and
   a surface area between 200 m$^2$/g and 2000 m$^2$/g.

2. The method of claim 1, wherein the halosilane gas and the reducing gas are separately introduced into the SiC growth system.

3. The method of claim 1, wherein reaction between the gaseous halosilane and the reducing gas of step (b) occurs in a reaction zone that exists on a side of the solid carbon source material opposite the silicon carbide seed crystal.

4. The method of claim 1, wherein the SiC growth system is heated such that a temperature gradient forms where the silicon carbide seed crystal is at a lower temperature than the solid carbon source material.

5. The method of claim 1, wherein:
   the SiC growth system includes a growth crucible;
   all of the solid carbon source material is positioned in spaced relation between the ends of the growth crucible; and
   the silicon carbide seed crystal is positioned on one end of the growth crucible.

6. The method of claim 5, wherein:

the growth crucible includes one or more gas inlets for introducing the gaseous halosilane and the reducing gas into an end of the growth crucible opposite the silicon carbide seed crystal; and the growth crucible includes one or more gas outlets.

7. The method of claim 6, wherein gaseous byproducts of steps (b, c and e) exit the growth crucible via the one or more gas outlets.

8. The method of claim 5, wherein:

the growth crucible includes a perforated plate supporting all of the solid carbon source material in spaced relation to an end of the growth crucible opposite the silicon carbide seed crystal; and the space between the perforated plate and the end of the growth crucible opposite the silicon carbide seed crystal defines a reaction zone where step (b) occurs.

9. The method of claim 8, wherein heating occurs such that a temperature gradient forms where the silicon carbide seed crystal is at a lower temperature than the carbon source material.

10. The method of claim 8, wherein the growth crucible and the perforated plate are made from a material that is substantially stable against erosion by Si vapor at SiC crystal growth temperatures.

11. The method of claim 10, wherein the growth crucible and the perforated plate are made from graphite.

12. The method of claim 1, wherein:

the reducing gas is hydrogen;

the halosilane gas is $SiCl_4$; or the reducing gas is hydrogen and the halosilane gas is $SiCl_4$.

13. The method of claim 1, wherein the silicon carbide seed crystal is a 4H, 6H, or 3C polytype.

14. The method of claim 1, further including introducing a nitrogen containing gas into the SiC growth system to grow an n-type silicon carbide single crystal.

15. The method of claim 1, further including introducing a gaseous aluminum precursor into the SiC growth system to grow a p-type silicon carbide single crystal.

16. The method of claim 1, further including introducing a gaseous vanadium precursor into the SiC growth system to grow a vanadium-doped, semi-insulating silicon carbide single crystal.

* * * * *